United States Patent

[11] 3,597,761

[72] Inventors Jerry J. Fraschilla
Sunnyvale;
Robert D. Caveney, San Jose; Ronnie M. Harrison, San Jose, all of, Calif.
[21] Appl. No. 876,787
[22] Filed Nov. 14, 1969
[45] Patented Aug. 3, 1971
[73] Assignee American Astronics, Inc.
Palo Alto, Calif.

[54] HIGH-SPEED ANALOG-TO-DIGITAL CONVERTER AND METHOD THEREFOR

9 Claims, 5 Drawing Figs.

[52] U.S. Cl. 340/347 AD
[51] Int. Cl. H03k 13/06
[50] Field of Search 340/347

[56] References Cited
UNITED STATES PATENTS
3,188,624 6/1965 McMillian 340/347
3,384,889 5/1968 Lucas 340/347
3,425,054 1/1969 Cowan 340/347

*Primary Examiner*—Daryl W. Cook
*Assistant Examiner*—Jeremiah Glassman
*Attorney*—Flehr, Hohbach, Test, Albritton & Herbert ABSTRACT: An analog-to-digital converter having first and second comparator banks where the analog input voltage is applied to both of the comparator banks simultaneously to allow the second subranging comparator bank to slew and settle simultaneously with the switching operations of the first comparator bank. Discrete reference level voltages are selected by the first comparator bank in response to the analog input voltage and switched to the second comparator bank and serve to adjust the threshold detection level of the second bank. In an alternative embodiment two sample and hold circuits alternately apply samples taken at different times to the two comparator banks.

INVENTORS
JERRY J. FRASCHILLA
ROBERT D. CAVENEY
RONNIE M. HARRISON
BY Flehr, Hohbach, Test, Albritton & Herbert
ATTORNEYS

*INVENTORS*
JERRY J. FRASCHILLA
ROBERT D. CAVENEY
RONNIE M. HARRISON
BY Flehr, Hohbach, Test, Albritton & Herbert
ATTORNEYS INVENTORS
JERRY J. FRASCHILLA
ROBERT D. CAVENEY
RONNIE M. HARRISON
BY Flehr, Hohbach, Test, Albritton & Herbert
ATTORNEYS

HIGH-SPEED ANALOG-TO-DIGITAL CONVERTER AND METHOD THEREFOR

BACKGROUND OF THE INVENTION

The present invention is directed to a high-speed analog-to-digital converter and method therefor and more particularly to a converter which also has high accuracy.

In conventional high-speed analog-to-digital converters operational amplifiers are used causing slew rate and settling time problems. For example, in a typical parallel detection subranging scheme two or more banks of threshold detectors are used. Each bank simultaneously reaches a decision as to the approximate magnitude of the voltage applied to it. In the case of the first bank of detectors the applied voltage is the actual analog input signal voltage. The voltage applied to the second and subsequent banks is the analog input voltage less the threshold reference voltage indicated by the previous bank. The above subtraction process requires an operational amplifier which has the foregoing defects of slew rate and settling time.

OBJECTS AND SUMMARY OF THE INVENTION

It is, therefore, a general object of the present invention to provide an improved analog-to-digital converter and method therefor.

It is another object of the invention to provide a converter as above which has high operating speed but yet provides good accuracy and resolution.

In accordance with the above objects there is provided apparatus for converting an input electric signal from an analog to a digital format, the format having a plurality of information bits. The apparatus includes a voltage source for providing a plurality of discrete reference voltage levels. First comparator means compare the input signal with the discrete reference voltage levels and selects one of these reference voltages which is approximately equal to the magnitude of the input signal. This provides the most significant bit of the digital format. The second comparator means includes means for subtracting the selected reference voltage from the input signal and for comparing the difference amount with a plurality of second reference levels to select one of these reference levels approximately equal to the difference amount to provide the least significant bits of the digital format.

DETAILED DESCRIPTION OF THE PREFERRED EMBODIMENT

Figure 1:
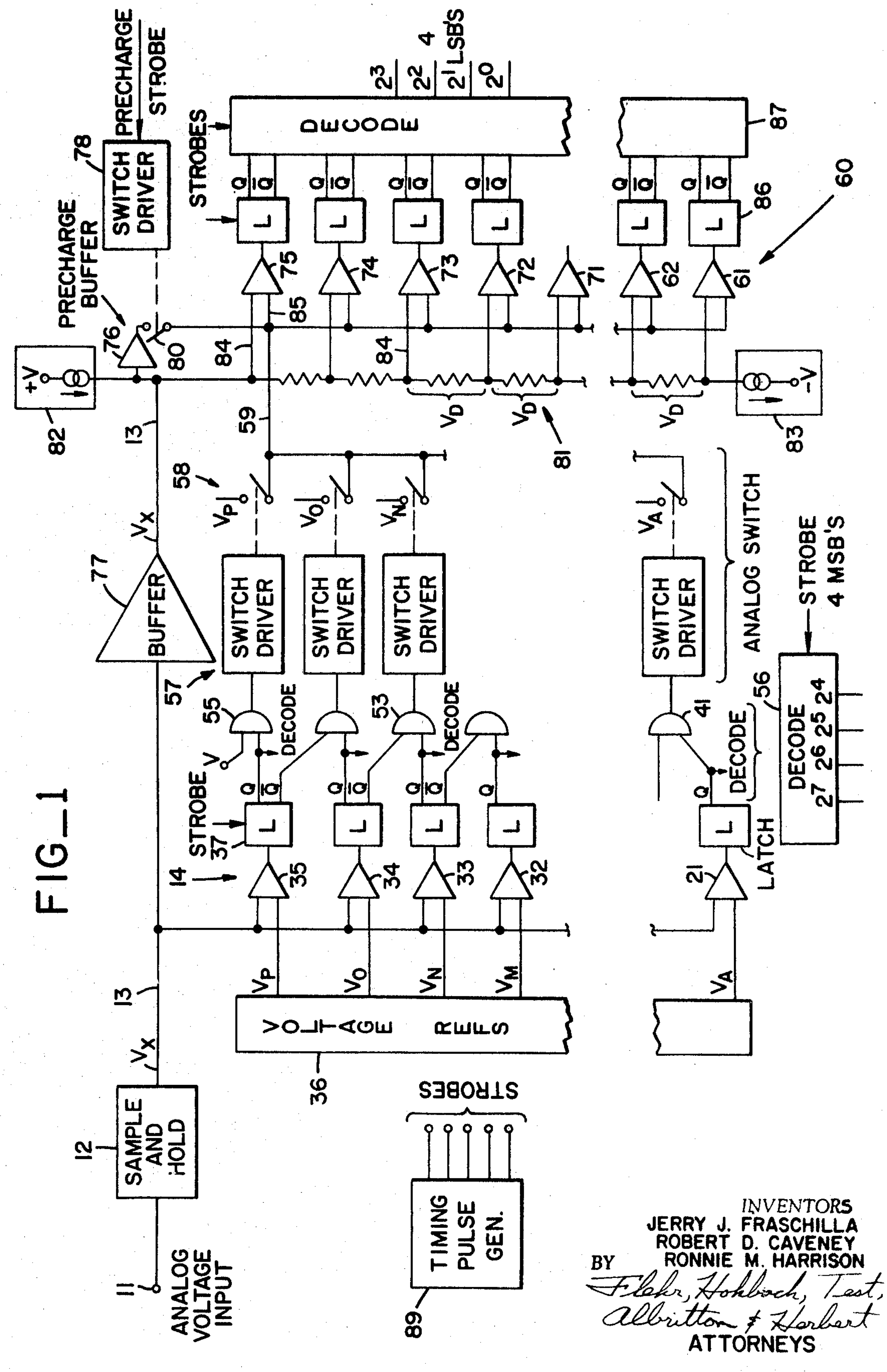
FIG. 1 is a block diagram of an analog-to-digital converter circuit incorporating the present invention.

Referring first to FIG. 1, an analog signal to be converted to digital format is coupled to input terminal 11. This signal is converted by the invention into a digital format having a plurality of information bits designated the four most significant bits (MSB's) and four least significant bits (LSB's). Since these bits would normally be in a binary number system format the eight bits range from $2^0$ to $2^7$. The analog input signal on input 11 is coupled through a sample and hold network 12 to produce a sampled input signal on line 13 designated $V_x$. The input signal $V_x$ is coupled into a comparator bank generally designated as 14 which includes 15 threshold detectors 21 through 35. Only representative threshold detectors have been shown in the drawing. Line 13 is coupled to one of the pair of inputs of the threshold detectors and the other inputs are supplied reference level voltages by a voltage reference source 36. The voltage source has discrete output voltage levels of 15 different voltages $V_A$ through $V_P$ which are coupled to threshold detectors 21 through 35 respectively.

In operation, when voltage $V_x$ is present on line 13, the threshold detectors 21 through 35 as $V_x$ rises in magnitude will successively indicate their threshold detection starting with detector 21. The outputs of the threshold detectors are strobed into a temporary flip-flop storage or latches 37 by a timing pulse designated as a strobe input. The timing pulse is adjusted in time to allow settling of the sample and hold circuit 12 and the threshold detectors 14. Latch circuits 37 have outputs designated Q and $\bar{Q}$ which are coupled to AND gates 41 through 55. More specifically, the Q output of the latch associated with threshold detector 21, for example, is coupled to the AND gate 41 and so on. The other coincidence input of each AND gate is coupled to the $\bar{Q}$ output of an adjacent latch 37 and threshold detector corresponding to the next higher incremental value. Thus, if the voltage $V_x$ is greater than, for example, $V_N$ but less than $V_O$, threshold detector 33 will produce an output causing the latch to produce a true output on its Q line. But since $V_x$ is less than $V_O$ detector 34 will not be actuated and its associated latch will have a true indication on the $\bar{Q}$ output to thus produce a coincidence on AND gate 53. Thus, the comparator bank 14 will by means of the output of AND gate 53 indicate that the analog voltage $V_x$ is greater than $V_N$ but less than $V_O$.

This analog voltage is converted into the most significant bits of the final digital format by coupling the Q output all latches 37 to decode network 56. The decode network responds to true indications on the Q outputs of latches 37 and digitally counts from $V_A$ through $V_N$. The number of threshold detectors 14 determines the number of most significant bits which are available. Specifically, $2^n-1$ threshold detectors are required for $n$ bits of input signal resolution. Thus, for four bits as illustrated, $2^4-1$ or 15 threshold detectors and associated latches and AND gates are required.

The outputs of AND gates 41 through 55 are coupled to an analog switch which includes a bank of switch drivers 57 and switches 58. One terminal of each of the switches is coupled, as indicated, to the discrete reference voltage levels $V_A$ through $V_P$ and the other terminal to a common line 59. Because of the logical decision of the AND gates 41 through 55 only one discrete voltage level at a time is coupled on line 59 to a second bank of comparators 60. More particularly, line 59 is coupled to one of the inputs 85 of threshold detectors 61 through 75.

Before a reference voltage level on line 59 is coupled to threshold detectors 61 through 75, on the inputs 85, the detectors are precharged to the magnitude of $V_x$ through a precharge buffer 76 which is coupled to line 13 through an intermediate buffer 77. Specifically, the precharge buffer 76 is coupled to the reference voltage level input detectors 61 through 75 through a switch 80 driven by a switch driver 78 which in turn is actuated by a precharge strobe input. Since $V_x$ will be very close to the reference level voltage $V_N$ to be applied to all of the reference level inputs of the detectors 61 through 75 the stray capacitance etc. will be charged by $V_x$ eliminating or substantially diminishing the settling and slew time of the inputs 85 of the threshold detectors.

$V_x$ is continuously coupled by means of line 13 to the other input terminals 84 of the detectors to eliminate any settling time with respect to that input terminal. It is also apparent that the sample and hold circuit maintains the $V_x$ value constant during all of the above procedure so that the same value of $V_x$ is applied to the comparator bank 60 as to the comparator bank 14. Thus, in summary the application of $V_x$ to detectors 61 through 75 before the selected analog switch supplies $V_N$ shortens the slew time of the entire circuit.

The voltage $V_x$ applied on line 13 to the threshold detectors 61 through 75 is directly applied to the top detector 75 but is dropped or diminished by the value $V_D$ formed by a precision resistor string 81. The precision resistor string 81 consists of a number of identical resistors and is coupled to a current source 82 at one end and a current sink 83 at the other end to thus provide identical voltage drops $v_D$ across each individual resistor. Thus, the actual voltage applied to inputs 84 of the threshold detectors 61 through 75 is determined by $$V_x - n_x = V_X \quad (1)$$

where $V_x$ is the analog voltage input on line 13, $V_D$ is the voltage drop and $n_x$ the number of voltage drops before a comparison occurs with one of the voltage levels (in this example, $V_X$) of comparator bank 14. Such comparison is based on the same theory as with comparator bank 14. Each of the threshold detectors 61 through 75 are coupled to latches 86 having respective Q and $\bar{Q}$ outputs with such outputs being coupled directly, however, to a decode network 87 which is responsive to the true indication on the Q output of the latches 86 to provide the four least significant bits of the digital format of the converted analog signal.

Figure 3:
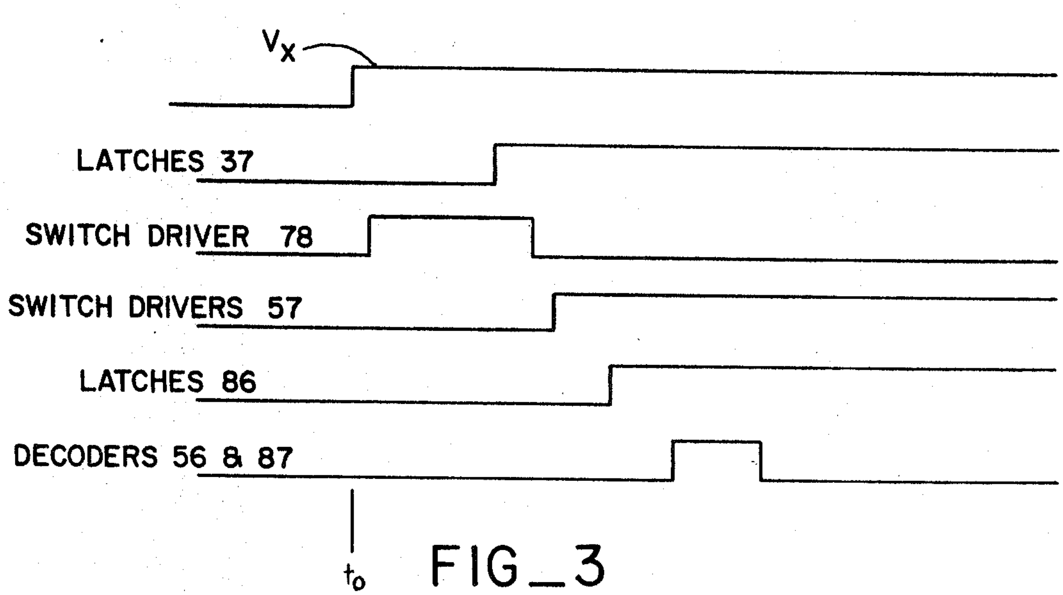
FIG. 3 is a set of timing diagrams useful in understanding the invention.

Proper timing for all of the strobe inputs, for example, the precharge strobe input to switch driver 78 and the various latches and decode networks is provided by a timing pulse generator 89. FIG. 3 shows a timing diagram illustrating the sequence timing in the circuit of FIG. 1. The analog input voltage at terminal 11 is sampled by the sample and hold circuit to provide a sampled voltage $V_x$. This is maintained continuously during the interval of conversion of the analog signal to digital format. Application of $V_x$ on line 13 to the first comparator bank 14 actuates the appropriate latches 37 to cause a coincidence output on one of the AND gates 53. However, before the associated switch driver 57 is actuated the precharge strobe actuates switch driver 78 to precharge the second comparator bank 60. Thereafter the switch driver 57 is actuated to apply the appropriate reference voltage level to the comparator bank 60. The outputs of the threshold detectors 61 through 75 are stored in latches 86 by an appropriate strobe pulse input and thereafter after appropriate settling time the contents of the decoders 56 and 87 are read out.

Thus, in operation the first comparator bank in effect compares the input signal with a plurality of discrete reference voltage levels from voltage reference source 36 and selects one voltage level which in this example is $V_X$. The second comparator bank 60 is precharged by precharge buffer 76 and switch driver 78 to thus reduce slewing time and thereafter the reference voltage selected is applied to one of the inputs of threshold detectors 61 through 75. The other comparison input has already been coupled to the analog voltage $V_x$ so these terminals have in effect been charged also.

The comparator bank 60 in effect subtracts the selected reference voltage $V_X$ from the input signal $V_x$ and compares the difference amount with a plurality of second reference levels provided by the precision resistors 81. This is shown by a rewriting of equation (1) as follows:

$$V_x - V_X = n_x V_D \quad (2)$$

Figure 2:
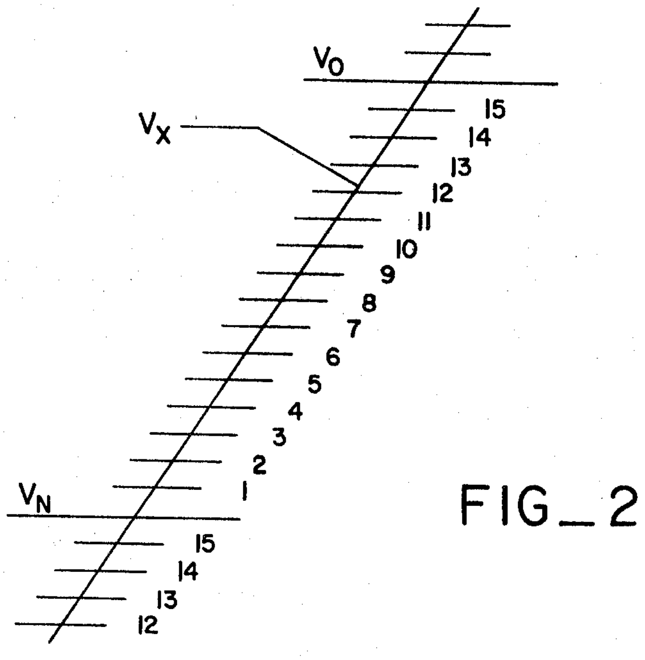
FIG. 2 is a graph useful in understanding the invention.

In the example given, the detectors 61 through 72 will be actuated since as shown in FIG. 2, $V_x$ is greater than the threshold level of detector 72.

In actual practice, equation (1) accurately states that the input analog signal $v_x$ is translated downward by successive steps of $V_D$ until $V_X$ is produced. Alternatively, the precision resistor string may operate on the reference voltage from source 36 to translate this voltage downward to approximately equal $V_x$. This would necessitate only a slight change in logic and polarities.

If desired, the sample and hold circuit 12 may be replaced by a delay line which would be placed between the comparator banks 14 and 60. The delay, of course, would be critical in that it would necessarily match the threshold detection switch time propogation of bank 14 so that the same input signal $V_x$ would be applied to both banks.

Figure 4:
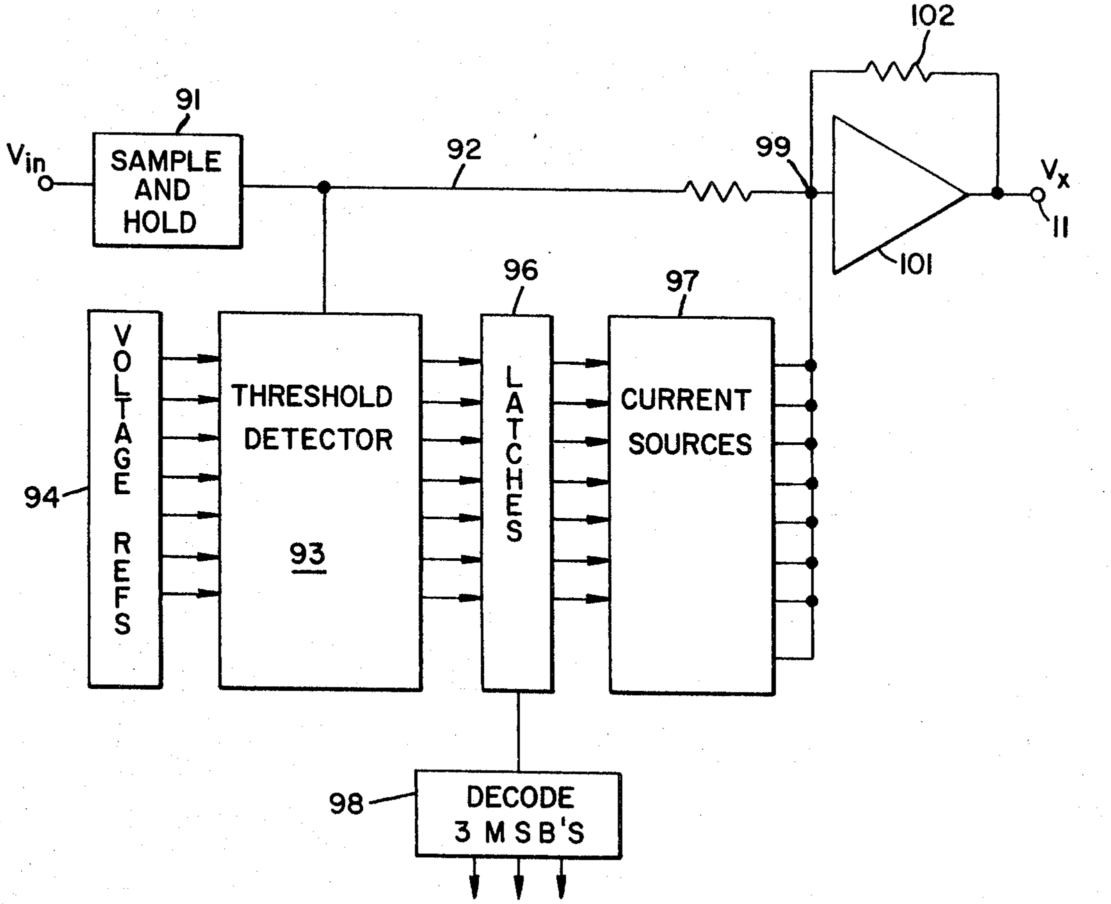
FIG. 4 is a block diagram showing a modification of the embodiment of FIG. 1.

In order to increase the resolution of the converter of the present invention an additional stage as shown in FIG. 4 may be attached to terminal 11 to supply more most significant bits. The voltage input designated $v_{in}$ is coupled to a sample and hold network 91 similar to the network 12 of FIG. 1. The output of sample and hold network 91 on line 92 is, in a manner similar to FIG. 1 coupled to threshold detectors 93 which in turn are coupled to a voltage reference source 94 and have comparison outputs coupled to latches 96 which drive current sources 97. The output of the latch network is coupled to a decode unit 98 which upon command produces the three most significant bits. The magnitude of the current source output is related to a specific threshold detector and this is coupled to a node 99 which subtracts current from the node and in essence takes the difference between the current mode input signal $V_{in}$ and the selected current source 97. This difference current is coupled into an operational amplifier 101 having a feedback resistor 102 and serves as the $V_x$ voltage coupled into terminal 11 of FIG. 1. The operational amplifier 101 multiplies the difference by some fixed gain to bring the output up to a suitable input voltage for the analog to digital converter operation previously described in relation to FIG. 1.

The above alternative embodiment of FIG. 4 while increasing resolution and accuracy of the present invention does so at the expense of speed since the comparator current sources etc. must be allowed to settle.

Figure 5:
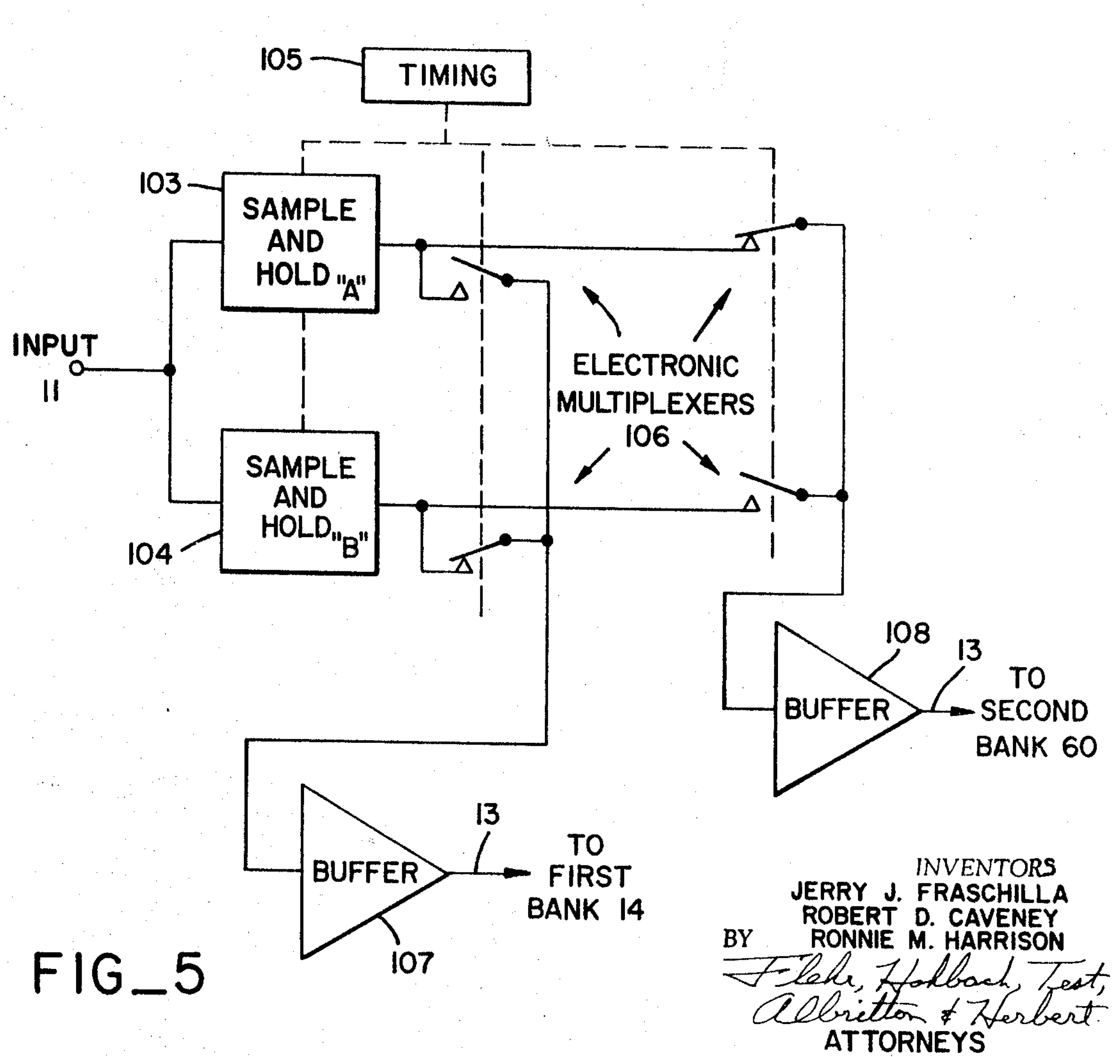
FIG. 5 is a block diagram of an alternative embodiment of the invention.

FIG. 5 illustrates an alternative embodiment which may be used to increase the conversion rate of the input signal from analog to digital format by a factor of 2. The modification of FIG. 5 would be applied to FIG. 1. Specifically, two sample and hold circuits 103 and 104 are provided in place of sample and hold circuit 12 and each of the two sample and hold circuits is sequentially controlled by a timing unit 105 to couple the held input signal to first comparator bank 14 and then to second comparator bank 60. This switching is accomplished through electronic multiplexer 106.

The sequential switching has the following pattern. At a first instant in time the input voltage from an input test waveform on input 11 is sampled by sample and hold circuit "A" and held. It is then applied through the proper switches, multiplex switch 106, through a buffer 107 to a first bank 14. The comparator selects the appropriate reference voltage which is coupled to the second bank 60. At the same time, electronic multiplexer 106 decouples the sample and hold "A" from the first bank 14 and couples it to the second bank 60 through a buffer 108. The second bank as discussed above then selects the appropriate voltage level to provide the least significant digits. However, concurrently with this selection of the voltage level by the second comparator bank 60 the first comparator bank has been coupled to sample and hold "B" and is selecting the appropriate voltage level to match a previously sampled second input signal which was taken at a later instant in time. Thus, since both banks of comparators are being used simultaneously, the present method increases the conversion rate by a factor of 2.

Therefore, the circuit of FIG. 5 may be used to easily modify the circuit of FIG. 1. However, since the input signal is not continuously coupled to the second bank in the embodiment of FIG. 5, the precharge circuit of FIG. 1 would not be used.

In summary, the apparatus and method of the present invention for converting analog signals to digital signals greatly reduces conversion time by allowing the analog voltage circuit which includes the comparator banks to slew and settle simultaneously with the switching operation. No time-consuming operations are performed on the analog voltage itself as is the case with sequential approximation or a ramp-type analog-to-digital converter.

We claim:

1. A method of converting an input electric signal from an analog to a digital format having a plurality of information bits where first comparator means provide the most significant bits of said digital format and second comparator means provide the least significant bits, said method comprising the following steps: coupling said input signal to said first comparator means; comparing said input signal with a plurality of discrete reference voltage levels and selecting one of said reference voltages approximately equal to the magnitude of said input signal to provide said most significant bits; thereafter coupling said one reference voltage to said second comparator means to adjust the reference threshold thereof; coupling said input signal to said second comparator means; and subtracting said one reference voltage from said input signal and comparing the difference amount to a plurality of reference levels to provide said least significant bits.

2. A method as in claim 1 where said steps of coupling said input to said first and second comparator means are performed simultaneously.

3. A method as in claim 1 including the step of precharging said second comparator means with said input signal prior to application of a reference voltage to said second comparator means.

4. A method as in claim 1 where said subtracting step includes the step of translating said input signal successively downward by steps and comparing said one reference voltage with said input signal reduced by a number of steps to provide a comparison said number of steps providing said least significant bits.

5. A method of converting an input electric signal from an analog to a digital format having a plurality of information bits where first comparator means provide the most significant bits of said digital format and second comparator means provide the least significant bits, said method comprising the following steps: sampling an input waveform at a first instant in time to provide a first input electric signal coupling said first input signal to said first comparator means; comparing said first input signal with a plurality of discrete reference voltage levels and selecting one of said reference voltages approximately equal to the magnitude of said input signal to provide said most significant bits; sampling said input waveform at a second later instant in time to provide a second electric input signal; coupling said second input signal to said first comparator means comparing said second input signal with said plurality of discrete reference voltage levels and selecting one of said reference voltages approximately equal to the magnitude of said input signal to provide said most significant bits; thereafter respectively coupling said selected reference voltages to said second comparator means to adjust the reference threshold thereof; coupling said first and second input signals to said second comparator means; and respectively subtracting said selected reference voltages from said respective input signals and comparing the difference amounts to a plurality of reference levels to provide said least significant bits for each input signal.

6. A method as in claim 5 where said step of providing said least significant bits for said first input signal is concurrent with said step of coupling said second input signal to said first comparator means.

7. Apparatus for converting an input electric signal from an analog to a digital format having a plurality of information bits comprising: a voltage source for providing a plurality of discrete reference voltage levels; first comparator means for comparing said input signal with said discrete voltage levels and for selecting one of said reference voltages approximately equal to the magnitude of said input signal to provide the most significant bits of said digital format; second comparator means; means for coupling said input signal to said second comparator means for precharging said second comparator means; means for coupling said one reference voltage to said second comparator means, said second comparator means including means for subtracting said one reference voltage from said input signal and for comparing the difference amount with a plurality of second reference levels to select one of said reference levels approximately equal to said difference amount to provide the least significant bits of the digital format.

8. Apparatus as in claim 7 where said coupling means for precharging said second comparator means couples said input signal to an input terminal of said second comparator means to which said one reference voltage is also coupled.

9. Apparatus as in claim 7 together with means for sequentially initiating said precharging of said second comparator means before said one reference is coupled to said second comparator means.